United States Patent [19]

Pezzini et al.

[11] Patent Number: 5,774,646
[45] Date of Patent: Jun. 30, 1998

[54] METHOD FOR DETECTING FAULTY ELEMENTS OF A REDUNDANCY SEMICONDUCTOR MEMORY

[75] Inventors: Saverio Pezzini, Vimercate; Roberto Ganzelmi, Vittuone; Maurizio Peri, Bergamo, all of Italy

[73] Assignee: SGS Thomson Microelectronics S.r.l., Agrate Brianza, Italy

[21] Appl. No.: 280,761

[22] Filed: Jul. 26, 1994

[30] Foreign Application Priority Data

Jul. 26, 1993 [EP] European Pat. Off. .............. 93830329

[51] Int. Cl.$^6$ .................................................. G06F 11/20
[52] U.S. Cl. ...................................................... 395/183.18
[58] Field of Search ............................. 395/575, 183.18; 364/970.1, 933.61, 933.62, 943.9; 371/21.1, 24, 25.1

[56] References Cited

U.S. PATENT DOCUMENTS

| | | | |
|---|---|---|---|
| 4,047,163 | 9/1977 | Choate et al. ....................... | 340/173 R |
| 4,051,354 | 9/1977 | Choate et al. ........................... | 235/312 |
| 4,051,460 | 9/1977 | Yamada et al. . | |
| 4,063,081 | 12/1977 | Handley et al. ......................... | 235/312 |
| 4,156,905 | 5/1979 | Fassbender .............................. | 364/200 |
| 4,535,420 | 8/1985 | Fung ....................................... | 364/900 |
| 4,862,418 | 8/1989 | Cuppens et al. ......................... | 365/201 |
| 5,224,101 | 6/1993 | Popyack, Jr. ........................... | 371/21.1 |
| 5,274,648 | 12/1993 | Eikill et al. ............................. | 371/21.2 |
| 5,331,644 | 7/1994 | Ishii et al. ............................... | 371/25.1 |

FOREIGN PATENT DOCUMENTS

A-2137784  10/1984  United Kingdom ............ G11C 29/00

OTHER PUBLICATIONS

IEEE Journal of Solid–State Circuits, vol. 27, No. 11, Nov. 1992, New York, US, pp. 1525–1531, Tanabe, et al., "A 30–ns 64–Mb DRAM with Built–in Self Test and Self–Repair Function".

Proceedings 23rd International Test Conference, Sep. 20, 1992, Baltimore, MD, pp. 623–631, Chen, et al., "A Self––Testing and Self–Repairing Structure for Ultra–Large Capacity Memories".

1981 International Test Conference, Digest of Papers, Oct. 27, 1981, pp. 49–55, Robert C. Evans, "Testing Repairable RAMs and Mostly Good Memories".

Haddad et al., "Increased Throughput for the Testing and Repair of RAM's With Redundancy" IEEE Trans. on Computers, vol. 40, No. 2, Feb. 1991, pp. 154–166.

*Primary Examiner*—Hoa T. Nguyen
*Assistant Examiner*—Stephen C. Elmore
*Attorney, Agent, or Firm*—David M. Driscoll; James H. Morris

[57] ABSTRACT

A method whereby the N elements of a memory are read sequentially, and the data items contained therein are compared with reference data items. Simultaneously with the reading of each element of the memory, its address is written in a number of redundancy check registers, each connected to a respective redundancy element. In the event the element of the memory differs from the reference data item, the first of the redundancy check registers is blocked to prevent it from being overwritten and the address of a faulty element of the memory is permanently stored. Upon the entire memory being read, the addresses of any faulty elements in the memory are thus already stored in the redundancy check registers.

5 Claims, 3 Drawing Sheets

METHOD FOR DETECTING FAULTY ELEMENTS OF A REDUNDANCY SEMICONDUCTOR MEMORY

BACKGROUND OF THE INVENTION

1. Field of the Invention

The present invention relates to a method for detecting faulty elements of a redundancy semiconductor memory.

2. Discussion of the Related Art

Electronic semiconductor memories are known to be formed of a number of memory cells arranged in an array of n rows and m columns.

In the case of redundancy memories, test machines for sequentially checking the base elements (rows and/or columns) are employed for detecting any faulty elements and replacing them with auxiliary ones.

The test devices provide for performing the following operations:

sequentially reading the memory cells:

comparing the read and expected values, and storing the addresses of the faulty cells;

locating the elements (rows and/or columns) containing faulty cells;

determining the auxiliary elements with which to replace the faulty elements; and writing the faulty element addresses in nonvolatile redundancy check registers.

The method employed on known test machines, particularly for sequentially reading the memory elements and writing the faulty element addresses in the nonvolatile check registers, are fairly complex, time-consuming and require either a dedicated external test machine or additional external hardware.

SUMMARY OF THE INVENTION

It is an object of the present invention to provide a method usable on a simplified test machine, and which provides for straightforward, rapid detection of faulty memory elements.

One embodiment of the invention includes a method for detecting a faulty element of a semiconductor memory having a plurality of elements including the steps of: a) reading a data item stored in an element of a main memory; b) temporarily storing an address of the element in at least one unblocked control memory location forming part of an accessory memory; c) comparing the stored data item with a reference data item; d) generating a faulty element signal, in the event the stored data item differs from the reference data item, and permanently storing the address of the read element in at least one permanent memory location; and e) repeating steps a)–d) for each element of the main memory.

A second embodiment of the method further includes, in step b), the step of storing the address of the element temporarily in a number of memory registers; and in step d) the step of associating the address of the faulty element with a code for subsequently disabling writing of the memory register containing the address.

In a third embodiment, the address of the faulty element is stored in a nonvolatile memory cell connected to the memory register.

In another embodiment, the method also includes the step of generating a code for disabling the element of the main memory and enabling redundancy memory.

In another embodiment, steps a) and b) of the method are performed simultaneously.

BRIEF DESCRIPTION OF THE DRAWINGS

A preferred non-limiting embodiment of the present invention will be described by way of example with reference to the accompanying drawings, in which.

DETAILED DESCRIPTION

Figure 1:
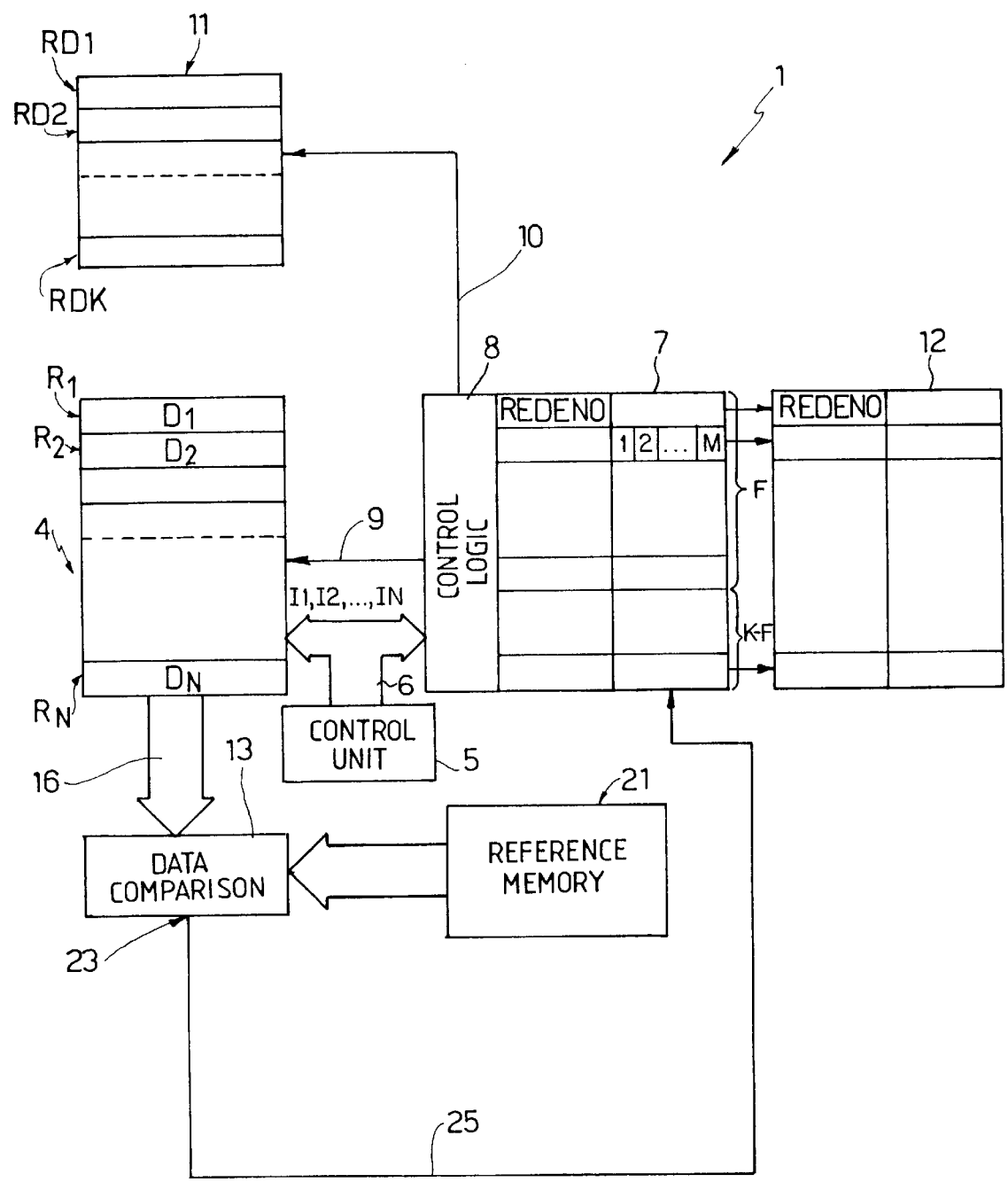
FIG. 1 shows a schematic view of a memory including a test machine implementing the method according to the present invention.

Number 1 in FIG. 1 indicates an electronic device including both memory elements and elements for implementing the method according to the present invention.

Device 1 includes a main EPROM memory 4, and k redundancy check registers 7 connected to main memory 4 by control logic 8 and a disabling line 9. In the example shown, main memory 4 is divided into N elements (rows R1, R2, . . . , RN), each containing a data item (data items D1, D2, . . . , DN), and each accessible by a respective address (addresses I1, I2, . . . , IN) generated by control unit 5 and supplied by address bus 6 to main memory 4 and to control logic 8 connected to redundancy check registers 7.

Redundancy check registers 7 are also connected to a redundancy memory 11 having k redundancy elements (in this case, rows RD1, RD2, . . . , RDk), each connected to a respective redundancy check register 7.

Redundancy check registers 7 are addressed by control unit 5, and each include M bits for writing the element addresses of main memory 4, and a control bit REDENO.

More specifically, the control bit may assume two different logic states. For example, one logic state, "O" (REDENO=0) indicates unblocked status of respective register 7. Furthermore, another logic state, "1" (REDENO=1) indicates blocking of the data item (address) stored in respective register 7 thereby disabling the main memory 4 element whose address is specified in respective register 7 (as shown by line 9) and enabling the associated element in redundancy memory 11 (as shown by line 10).

As already stated, redundancy check registers 7 are connected to control logic 8, which, during normal operation of main memory 4 (read), compares the addresses supplied over address bus 6 with the content of each register 7, and, in the event they match, enables the redundancy element connected to register 7, and activates disabling line 9.

Each redundancy check register 7 is also connected to a respective nonvolatile memory cell 12 (of M bits) in which the content (address) of respective register 7 (when blocked) is stored permanently at the end of testing, and from which said address is copied into the relative register 7. In other words, for the k redundancy control registers, there are provided k nonvolatile memory cells 12 for permanently storing the addresses of any faulty elements in main memory 4.

Device 1 also comprises a data comparing block 13 for comparing data supplied by main memory 4 over line 16 with data supplied by a reference memory 21 comprising one or more registers.

Data comparing block 13, preferably in the form of a combination of EXOR circuits, presents an output 23 connected over line 25 to the control input of registers 7. The logic value (zero/one) of output 23 depends on a positive or negative comparison of a data item from main memory 4 and a corresponding data item from reference memory 21.

Figure 2:
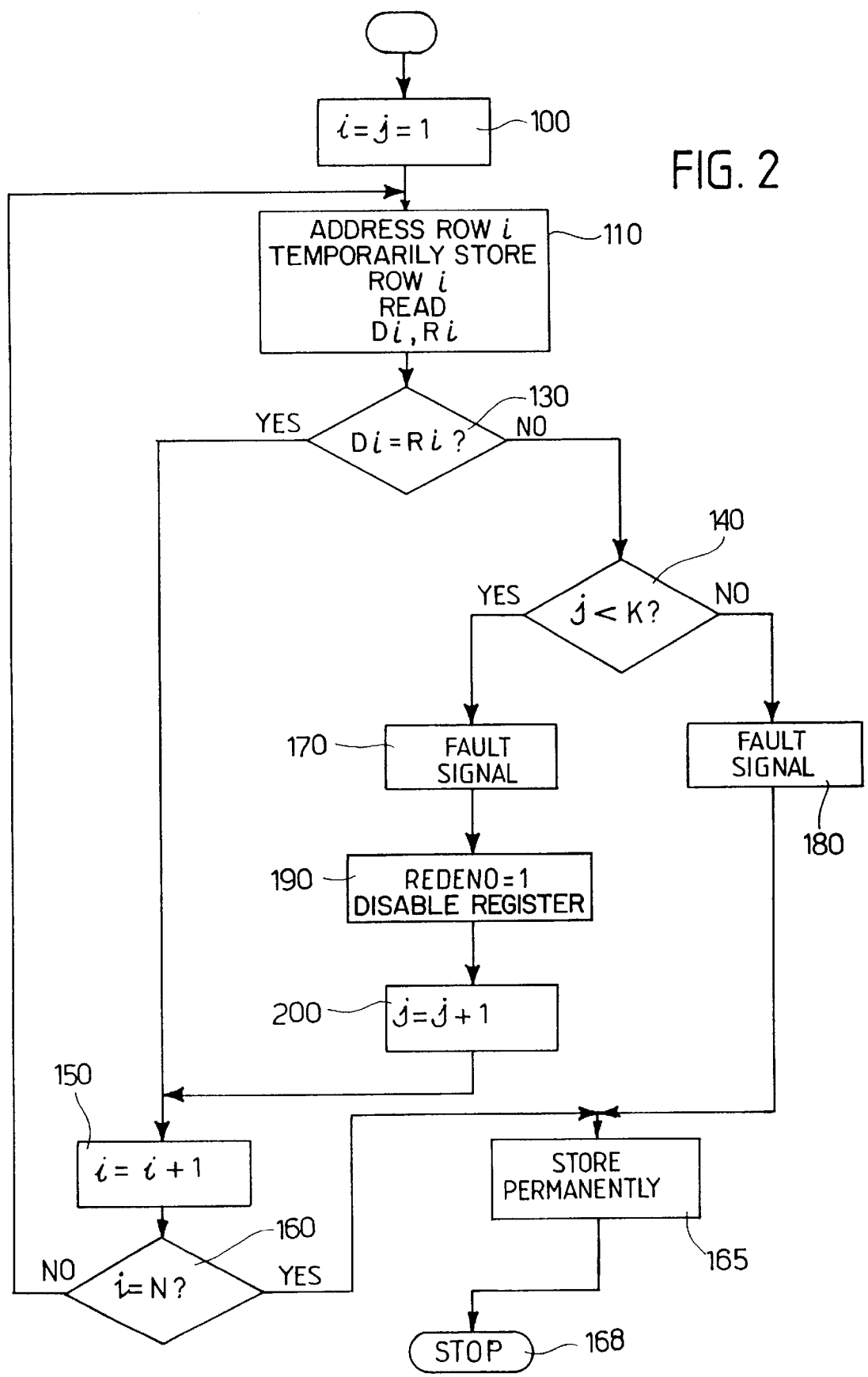
FIG. 2 shows a logic block diagram of the steps of the method according to a preferred non-limiting embodiment of the present invention.

FIG. 2 shows a logic block diagram of the operations performed by device 1 according to a method of the present invention.

To begin with, in block 100, the contents i and j of two counters (not shown) in control unit 5 are made equal to 1 via logic operations i=1 and j=1.

Block 100 then proceeds to block 110 in which the i-th row (e.g. row R1 of the first read cycle) in main memory 4 is addressed (and the relative data item read), and in which the address of the selected i-th row is stored in all the redundancy check registers 7 in which the REDENO bit presents an unblocked status logic value (zero in the example shown).

Block 110 then proceeds to block 130 in which, by means of block 13, the i-th data item read in block 110 is compared with a corresponding reference data item supplied by reference memory 21.

In the event of a negative response (differing read and reference data items), block 130 proceeds to block 140; whereas, in the event of a positive response (matching read and reference data items), block 130 proceeds to block 150 in which the content i of the counter is increased by one unit via logic operation i=i+1.

Block 150 is followed by block 160 in which i is compared with a whole number N equal to the number of rows in main memory 4. In the event of a positive response (all the rows in main memory 4 checked), block 160 proceeds to block 165, in which the content of every blocked redundancy check register 7 (when, for example, REDENO bit=0) is stored in a respective nonvolatile memory cell 12, and from there to STOP block 168. Conversely, in the event of a negative response in block 160 (not all the rows in memory 4 have been checked), block 160 proceeds back to block 110, which provides for reading the next row (e.g. R2) to be read.

In block 140, variable j is compared with a whole number k equal to the number of redundancy check registers 7. If j is less than k (number of registers 7 available), block 140 proceeds to block 170.

Conversely, if j is not less than k (j=k), block 140 proceeds to block 180 in which an error signal is generated indicating registers 7 have all been used (number of faulty elements in main memory 4 greater than the number of available registers 7 and redundancy elements 11). Block 180 then proceeds to block 165.

Block 170 provides for generating an error signal indicating a malfunction or a fault in the i-th element (row) of main memory 4, by virtue of the i-th data item read by block 110 differing from the i-th reference data item.

Block 170 proceeds to block 190 in which the REDENO bit of the j-th register 7 is set to the blocked data item (address) logic state, so as to prevent the j-th register from being written, and the address relative to the faulty row is stored permanently.

The switch in the logic level of the REDENO bit also results in enabling the respective element (j-th row) in redundancy memory 11, and disabling the i-th element in main memory 4, which is thus replaced by the j-th redundancy element.

Block 190 proceeds to block 200 in which j is increased by one unit via logic operation j=j+1, and which then proceeds back to block 150.

Thus, when all the N elements in main memory 4 have been read, the first F registers 7 contain the addresses of any F number of faulty elements in main memory 4.

The first F registers 7 also present a REDENO bit equal to one, while the remaining k-F registers 7 contain the address corresponding to the last data item read by block 110, and present a zero REDENO bit.

The method according to the present invention therefore provides for sequentially checking elements R1, R2, ..., RN and data items D1, D2, ..., DN in main memory 4; for storing the addresses of any faulty elements in redundancy check registers 7; and for automatically addressing the corresponding elements in redundancy memory 11 when addressing main memory 4, thus simplifying and reducing the performance time of the test procedure.

To those skilled in the art it will be clear that changes may be made to the memory device and method described and illustrated herein without, however, departing from the scope of the present invention.

For example, the redundancy structure of main memory 4 may differ form that described (e.g. in terms of columns and/or rows).

Figure 3:
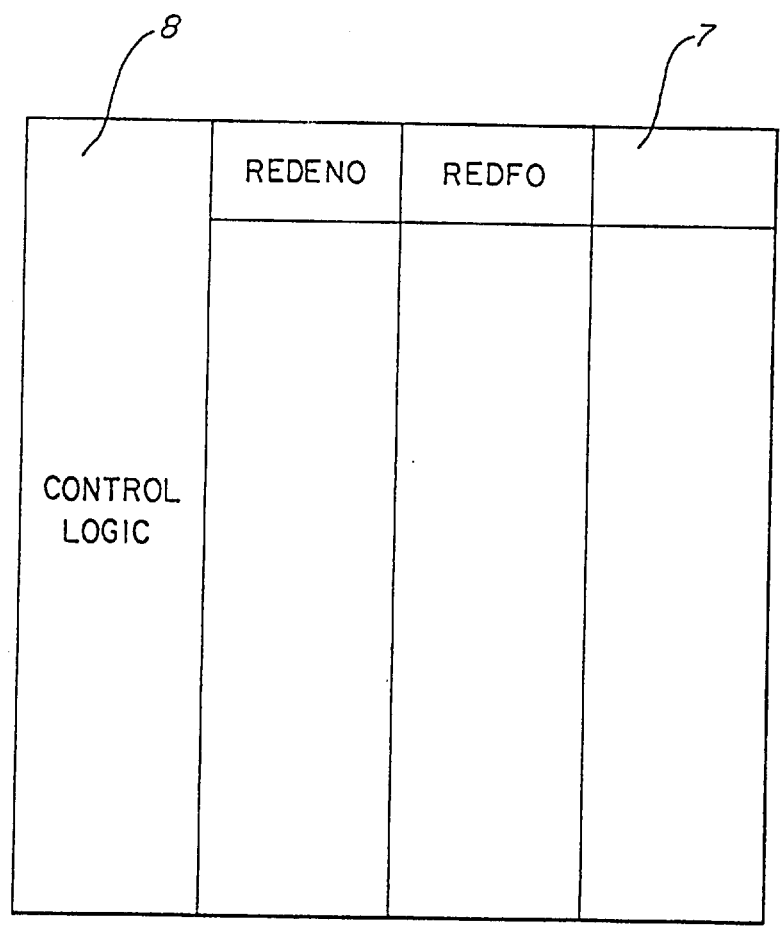
FIG. 3 shows an alternative embodiment of the redundancy check register of FIG. 1.

Another example, shown in FIG. 3, is where in addition to the REDENO code, each redundancy check register 7 presents a second REDFO code designed to assume a first logic value (e.g. "1", REDFO=1) in the event of a fault in the respective redundancy memory 11 element.

In this case, before the address of the last element read in main memory 4 is written into all the redundancy check registers 7 (block 110), the efficiency of the available redundancy elements is checked, and any faulty redundancy elements are automatically excluded.

According to another embodiment, instead of writing the address of the selected i-th row in all the redundancy check registers 7 which are in the unblocked state (block 100 of FIG. 2), such address is stored in a single redundancy check register 7, for example the register 7 following the last blocked register 7.

It should be pointed out that device 1 may also implement functions other than what is described herein. For example, it may define an automatic test stage for scanning the memory elements and, among other things, implementing the method according to the present invention under the control of control unit 5. More specifically, in the case of a row and column redundancy structure, the control unit performs all the decision-making functions relative to performance of a row or column redundancy on the basis of predetermined criteria and algorithms. Finally, device 1 may form part of a more complex device (e.g. a microcontroller or other dedicated device).

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method of detecting whether an element of a plurality of elements in a first memory is faulty, the method comprising the steps of:

(a) addressing of one of the plurality of elements in the first memory, the plurality of elements each having an address, in order to access a content of the one of the plurality of elements and to provide the address of the one of the plurality of elements to a second memory for storage of the address in one of a plurality of registers of the second memory;

(b) comparing after step (a), the content of the one of the plurality of elements to a reference; and (c) changing a state of the plurality of registers of the second memory if the content and the reference are unequal;

wherein each of the plurality of registers of the second memory includes a first portion and a second portion, wherein step (a) includes the step of storing the address of the one of the plurality of elements in the first portion of the one of the plurality of registers, and wherein step (c) includes the step of storing a code in a second portion of the one of the plurality of registers to change the state of the one of the plurality of registers.

2. A method of detecting whether an element of a plurality of elements in a first memory is faulty, the method comprising the steps of:

(a) addressing of one of the plurality of elements in the first memory, the plurality of elements each having an address, in order to access a content of the one of the plurality of elements and to provide the address of the one of the plurality of elements to a second memory for storage of the address in one of a plurality of registers of the second memory;

(b) comparing, after step (a), the content of the one of the plurality of elements to a reference; and (c) changing a state of the one of the plurality of registers of the second memory if the content and the reference are unequal;

wherein step (a) includes the steps of:
  checking the state of the one of the plurality of registers of the second memory;
  temporarily storing the address in the one of the plurality of registers if the checked state indicates that the one of the plurality of registers is unblocked; and
  temporarily storing the address in another of the plurality of registers of the second memory if the checked state indicates that the one of the plurality of registers is blocked.

3. The method of claim 1, wherein the second memory is volatile memory, and wherein the method further comprises the steps of:

repeating steps (a)–(c) for another of the plurality of elements of the first memory so that the address of the another of the plurality of elements is provided to another of the plurality of registers, and a state of the another of the plurality of registers of the second memory is changed if a content of the another of the plurality of elements and a respective reference are unequal; and copying, after the step of repeating steps (a)–(c), the content of each of the one and the another of the plurality of elements from the second memory to a non-volatile memory.

4. The method of claim 1, wherein the plurality of registers of the second memory includes a third portion, and wherein the method further comprises the steps of:

detecting a fault in an element of a third memory; and storing a code in said third portion of the second memory when a fault is detected in the element of the third memory.

5. The method of claim 3, further comprising the step of storing a content of the non-volatile memory into said plurality of registers of the second memory.

* * * * *